United States Patent
Fujimura et al.

(10) Patent No.: US 7,355,326 B2
(45) Date of Patent: Apr. 8, 2008

(54) PIEZOELECTRIC TRANSFORMER

(75) Inventors: Takeshi Fujimura, Sendai (JP);
Masaaki Toyama, Saitama (JP)

(73) Assignee: Taiheiyo Cement Corporation, Tokyo (JP)

( * ) Notice: Subject to any disclaimer, the term of this patent is extended or adjusted under 35 U.S.C. 154(b) by 176 days.

(21) Appl. No.: 10/573,295

(22) PCT Filed: Sep. 24, 2004

(86) PCT No.: PCT/JP2004/013907

§ 371 (c)(1),
(2), (4) Date: Mar. 23, 2006

(87) PCT Pub. No.: WO2005/034257

PCT Pub. Date: Apr. 14, 2005

(65) Prior Publication Data

US 2007/0001554 A1    Jan. 4, 2007

(30) Foreign Application Priority Data

Sep. 30, 2003   (JP) ............................. 2003-341981

(51) Int. Cl.
*H01L 41/08* (2006.01)
(52) U.S. Cl. ...................... 310/366; 310/328; 310/359; 310/367
(58) Field of Classification Search ........ 310/330–332, 310/328, 366, 359
See application file for complete search history.

(56) References Cited

U.S. PATENT DOCUMENTS 6,051,915 A * 4/2000 Katsuno et al. ............ 310/359
6,278,227 B1 * 8/2001 Katsuno et al. ............ 310/359
6,362,560 B1 * 3/2002 Yang et al. ................. 310/359

FOREIGN PATENT DOCUMENTS

| JP | 2000-150981 A | 5/2000 |
|---|---|---|
| JP | 3119154 B2 | 10/2000 |
| JP | 2002-280631 A | 9/2002 |
| JP | 2002-305332 A | 10/2002 |

* cited by examiner

*Primary Examiner*—Mark Budd
(74) *Attorney, Agent, or Firm*—Birch, Stewart, Kolasch & Birch, LLP

(57) ABSTRACT

A piezoelectric transformer, which operates in a half wavelength mode, includes an input part having input electrodes laminated in a thickness direction on a central part in a longitudinal direction of a piezoelectric element with rectangular shape, in which the input part is polarized in the thickness direction between the input electrodes, a pair of output parts provided along the longitudinal direction so as to sandwich the input part, in which the output parts are polarized in the same direction along the longitudinal direction, and an output electrode provided at an end part of each of the output parts, wherein $L_1$, $L_2$ and $L_3$ satisfy a relationship of $0.1 \leq (4L_2 - L_3)/4L_1 \leq 0.5$, where $L_1$ is a length of the piezoelectric element in the longitudinal direction, $L_2$ is a length of the input part in the longitudinal direction, and $L_3$ is a length of either one of the output electrodes in the longitudinal direction.

4 Claims, 6 Drawing Sheets

PIEZOELECTRIC TRANSFORMER

TECHNICAL FIELD

The present invention relates to a center drive type piezoelectric transformer used for an inverter or the like for a back light of a liquid crystal display.

BACKGROUND ART

In recent years, a piezoelectric transformer is adopted in an inverter for a back light of liquid crystal panel, a DC/DC converter or the like to realize a small-size and thin-type electric circuit.

FIG. 6 is a perspective view showing a conventional, general Rosen-type piezoelectric transformer. The Rosen-type piezoelectric transformer is an element in which ceramics of lead titanate zirconate (PZT)-based material is, for example, used as material. As shown in FIG. 6, in an input part 21 on the left half of a piezoelectric transformer 20, an input electrode 22 with conductors laminated in the thickness direction is provided, and a piezoelectric element between the input electrodes is subjected to polarization processing in the thickness direction. Furthermore, an output electrode 24 is provided on an end face of an output part 23 on the right half of the piezoelectric transformer 20 by, for example, silver baking or the like, and the piezoelectric element of the output part 23 is subjected to the polarization processing in the longitudinal direction.

Here, the input part corresponds to a part of a piezoelectric transformer where input electrodes are provided in the thickness direction and the piezoelectric element between the input electrodes is polarized in the thickness direction, and the output part corresponds to a part of the piezoelectric transformer where the output electrode is provided at the end part and the piezoelectric element between the output electrode and the input part is polarized in the longitudinal direction.

When an AC voltage with frequency nearly equal to a mechanical resonance frequency in the longitudinal direction is applied between the input electrodes of such a general Rosen-type piezoelectric transformer, a strong mechanical vibration is excited in the longitudinal direction of this piezoelectric transformer, and a high voltage is generated at the output electrode due to piezoelectric effect.

Recently, accompanying the trend toward small sized piezoelectric transformer, a center drive type piezoelectric transformer without occurrence of distorted wave has been developed (for example, patent document 1 (Japanese Patent Bulletin No. 3119154)). In this center drive type piezoelectric transformer, there is provided an input part with input electrodes laminated in the central part, and a piezoelectric element between the input electrodes is polarized in the thickness direction. Output parts on both sides of the central part are polarized respectively along the longitudinal direction, and at both end faces, output electrodes are provided by, for example, silver baking or the like.

[patent document 1] Japanese Patent Bulletin No. 3119154
[patent document 2] Japanese Patent Application Laid-Open No. 2000-150981
[patent document 3] Japanese Patent Application Laid-Open No. 2002-305332

DISCLOSURE OF THE INVENTION

Among the piezoelectric transformer described above, a center drive type piezoelectric transformer with output parts polarized along the longitudinal direction in the opposite direction provides voltages generated at two output electrodes and having an identical phase, and no current flows through a load connected between the output electrodes. Accordingly, even in such a configuration that a cold cathode tube is connected between the output electrodes at both ends of the piezoelectric transformer, the cold cathode tube does not light.

The piezoelectric transformer with output parts polarized in the opposite direction is therefore used in such a way that two cold cathode tubes are connected in series between the output electrodes at both ends and GND. When $+V_{out}$ is applied to the output electrode in the case of connecting one cold cathode tube, a voltage of 2 $V_{out}$ becomes necessary for two cold cathode tubes. Accordingly, power loss caused by parasitic capacitance with respect to a reflector of a back light of liquid crystal panel or a housing becomes four times as large as that in the case with one cold cathode tube.

Also when turning on a cold cathode tube with relatively high tube voltage used for a back light of a large scale liquid crystal panel, a general Rosen-type piezoelectric transformer has to be applied a relatively high tube voltage $V_{lamp}$ directly.

Recently, a liquid crystal panel has a trend to be produced large in size, and it becomes necessary for the cold cathode tube used for a back light to be long in length and high in tube voltage. Because high tube voltage leads to increase in power loss due to parasitic capacitance, this power loss caused by the parasitic capacitance becomes a reason for increasing power consumption of an inverter.

On the other hand, an output impedance of a piezoelectric transformer with output parts polarized in the same direction is $1/(2\pi f C_2/2)$ where f is frequency and $C_2$ is an electrostatic capacitance of an output on one side. Because this value is large, this piezoelectric transformer is not suited for the case of relatively large load impedance in the usages of such as two cold cathode tubes connected in series and a cold cathode tube with high tube voltage.

From the situation described above, there is a demand for a center drive type piezoelectric transformer with output parts polarized along the longitudinal direction in the same direction suitable for turning on a back light of large scale liquid crystal panel. Also in order to put into practical use the center drive type piezoelectric transformer with output parts polarized along the longitudinal direction in the same direction described above as an inverter for the back light of liquid crystal panel, a circuit for controlling two cold cathode tubes equally is necessary. At present, this circuit is also improved, and the demand for piezoelectric transformer with output parts polarized in the same direction described above is increasing further more.

However, in the situation of increasing demand on one hand, there is no document that is described on the real production, efficiency characteristic evaluation with respect to the electrode design, and study for practical usage of the center drive type piezoelectric transformer with output parts polarized along the longitudinal direction in the same direction, although there are a document on evaluation of the characteristics of the conversion efficiency as a function of a ratio of the input part length to the whole length of a center drive type piezoelectric transformer with output parts polarized along the longitudinal direction in the opposite direction and a document which mentions a center drive type piezoelectric transformer with output parts polarized along the longitudinal direction in the same direction.

The center drive type piezoelectric transformer with output parts polarized along the longitudinal direction in the same direction has the case where a sufficient efficiency cannot be realized and heat generation can be large depending on a design of the electrodes. Low efficiency in the piezoelectric transformer leads to increase in power consumption in using electric equipment with this transformer incorporated. Especially in the case where a low efficiency piezoelectric transformer is adapted to equipment such as a mobile-type notebook-sized personal computer and the like, power consumption increases and a life time of a battery decreases. Furthermore, reliability of functions of the piezoelectric transformer itself decreases caused by heat generation, which may also influence adversely elements and equipment on the periphery. In order to respond to an especially strong requirement for a long life of a battery in the notebook-sized personal computer, or to suppress the heat generation of the piezoelectric transformer to increase reliability of the transformer itself and peripheral equipment, increasing in efficiency of the piezoelectric transformer is indispensable.

It is an object of the present invention to provide a piezoelectric transformer with high efficiency in the case of a piezoelectric transformer with output parts polarized along the longitudinal direction in the same direction suitable for connection to a cold cathode tube with high tube voltage.

(1) In order to achieve the object described above, a piezoelectric transformer of the present invention which operates in a half wavelength mode is characterized by including an input part having input electrodes laminated in a thickness direction at a central part in a longitudinal direction of a piezoelectric element with rectangular shape, a pair of output parts provided along the longitudinal direction so as to sandwich the input part, and an output electrode provided at an end part of each of the output parts, wherein the input part is polarized in the thickness direction between the input electrodes, and the output parts are polarized in the same direction along the longitudinal direction, and wherein $L_1$, $L_2$ and $L_3$ satisfy a relation of $0.1 \leq (4L_2-L_3)/4L_1 \leq 0.5$ where $L_1$ is a length in the longitudinal direction of the piezoelectric element, $L_2$ is a length in the longitudinal direction of the input part, $L_3$ is a length in the longitudinal direction of either one of the output electrodes.

Thus, in the present invention, the quantity $(4L_2-L_3)/4L_1$ takes a value within a range between 0.1 to 0.5 with respect to a length in the longitudinal direction of the piezoelectric element $L_1$, a length in the longitudinal direction of the input part $L_2$, a length in the longitudinal direction of one of the output electrodes $L_3$.

Due to this, the efficiency of the piezoelectric transformer according to the present invention can be kept at high level from about 94% to 96%. As a result, when the piezoelectric transformer of the present invention is applied to electric equipment, its power consumption can be suppressed to a low level, and when applied to a notebook-sized personal computer, a long life of a battery which is strongly required can be achieved. Furthermore it is possible to suppress heat generation, to improve reliability on the function of the piezoelectric transformer itself, and to prevent peripheral elements or equipment from being adversely influenced by the heat generation. Further, particularly when connecting two cold cathode tubes which act as back lights of a liquid crystal panel, the piezoelectric transformer can be incorporated as a higher efficient inverter into a circuit of light-control drive for suppressing power loss caused by parasitic capacitance.

Further, since high efficiency can be kept stably as long as the quantity is within the range of the above formula, it becomes possible to facilitate mass production of a piezoelectric transformer with the functions as designed, and to increase a yield in the manufacturing process. Furthermore it becomes easy to select the optimum value in consideration for relationship to other characteristic items such as a step-up ratio.

(2) Moreover, the piezoelectric transformer according to the present invention is characterized in that the output electrodes are formed only at end faces of the respective outputs, and $L_1$ and $L_2$ satisfy the relationship of $0.1 \leq L_2/L_1 \leq 0.5$, where $L_1$ is the length in the longitudinal direction of the piezoelectric element and $L_2$ is the length in the longitudinal direction of the input part.

Since the output electrodes are thus provided at the peak position of vibration in the $\lambda/2$ mode, a step-up ratio can be increased. Furthermore, since the configuration of the output electrode can be simplified, it is possible to reduce residual stress in the periphery of the output electrodes.

(3) Also the piezoelectric transformer according to the present invention is characterized in that the output electrode is laminated in an inner layer part of the piezoelectric element in a thickness direction at the end part of respective output parts.

Thus, the output electrode of the piezoelectric transformer according to the present invention is laminated in the thickness direction of the piezoelectric element in the inner layer part at the end part of respective output parts. Due to this, efficiency of the piezoelectric transformer becomes higher.

Further, this laminated output electrode can be printed simultaneously with the printing of the input electrode at the central part during the manufacturing process of the piezoelectric transformer, and especially it does not require a process of baking electrodes on both of the end faces of piezoelectric element. This can improve the process efficiency during the manufacturing process. Additionally, in this case, external electrodes become necessary which connect to the output electrodes, however, they can be provided in one process simultaneously with production process of the external electrodes connecting to the input electrodes following the baking of the piezoelectric element.

(4) Furthermore, the piezoelectric transformer according to the present invention is characterized in that the external electrodes connecting to the input electrodes are provided at, at least, outer faces of the input part which are parallel to both the longitudinal direction and the thickness direction, and external electrodes connecting to the output electrodes are provided at, at least, both end faces of the respective output parts or at one of outer faces of the output parts which are parallel to both the longitudinal direction and the thickness direction.

Thus, in the present invention, the external electrodes connecting to the input electrodes and the external electrodes connecting to the output electrodes are provided respectively on the proper faces of the piezoelectric transformer. Due to this, in the production process of printing the external electrodes which act as extracting electrodes of the piezoelectric transformer, for example, by printing all together on a specified face, the printing process of the external electrodes can be finished by only one time of printing, thereby leading also to simplification and cost reduction of the manufacturing process. Also it is possible to select the face on which the external electrodes are disposed depending upon the situation of other process steps. Furthermore, when the piezoelectric transformer of the present invention is incorporated into a circuit, it is possible to select the face on which the external electrodes are disposed by taking account of the space and arrangement. As a result, it is possible to increase the efficiency of the manufacturing process and the adaptability in the circuit configuration. A [-shaped electrode configuration by the output electrode and its external electrode can increase the efficiency further more.

According to the piezoelectric transformer of the present invention, the efficiency of the piezoelectric transformer according to the present invention can be kept at high level from about 94% to 96%. As a result, when the piezoelectric transformer of the present invention is applied to electric equipment, its power consumption can be suppressed to a low level, and when applied to a notebook-sized personal computer, a long life of a battery which is strongly required can be achieved. Furthermore, it is possible to suppress heat generation, to improve reliability on the function of the piezoelectric transformer itself, and to prevent peripheral elements and equipment from being adversely influenced by the heat generation. Especially, when two cold cathode tubes are connected which act as back lights of a liquid crystal panel, the piezoelectric transformer can be incorporated as a higher efficient inverter into a circuit of light control drive for suppressing power loss caused by parasitic capacitance.

Further, since high efficiency can be kept stably as long as the quantity is within the range of the above formula, it becomes possible to facilitate mass production of a piezoelectric transformer with functions as designed, and to increase a yield in the manufacturing process. Also, it becomes easy to select the optimum value in consideration of other characteristic items such as a step-up ratio.

Moreover, according to the piezoelectric transformer of the present invention, since the output electrodes are provided at the peak position of vibration in the λ/2 mode, a step-up ratio can thus be increased. Furthermore, since the structure of the output electrode can be simplified, it is possible to reduce the residual stress in the periphery of the output electrodes.

Also, according to the piezoelectric transformer of the present invention, the output electrode is laminated in the thickness direction of the piezoelectric element in the inner layer part at the end part of each output part. Due to this, efficiency of the piezoelectric transformer becomes higher.

Further, this laminated output electrode can be printed simultaneously with the printing of the input electrode on the central part during the manufacturing process of the piezoelectric transformer, and especially it does not require a process of baking of electrodes on both of the end faces of the piezoelectric element. This can improve the process efficiency during the manufacturing process. In this case, external electrodes become necessary which connect to the output electrodes, however, they can be provided in one process simultaneously with providing and coating process of the external electrodes connecting to the input electrodes following the baking of the piezoelectric element.

Also, according to the piezoelectric transformer of the present invention, the external electrodes connecting to the input electrodes and the external electrodes connecting to the output electrodes are provided respectively on the predetermined faces of the piezoelectric transformer. Due to this, in the production process of printing the external electrodes which act as extracting electrodes of the piezoelectric transformer, by printing all together on a specified face, the printing process can be finished by only one time of printing, thereby leading also to simplification and cost reduction of the manufacturing process. Also, it is possible to select the face on which the external electrodes are disposed depending upon the situation of other process steps. Furthermore, when the piezoelectric transformer of the present invention is incorporated into a circuit, it is possible to select the face on which the external electrodes are disposed by taking account of the space and arrangement. As a result, it is possible to increase the efficiency of the manufacturing process and the adaptability in the circuit configuration. A [-shaped electrode configuration by the output electrode and its external electrode increases the efficiency further more.

BEST MODES FOR CARRYING OUT THE INVENTION

The best mode for carrying out the invention will be described below with reference to the drawings.

First Embodiment

Figure 1:
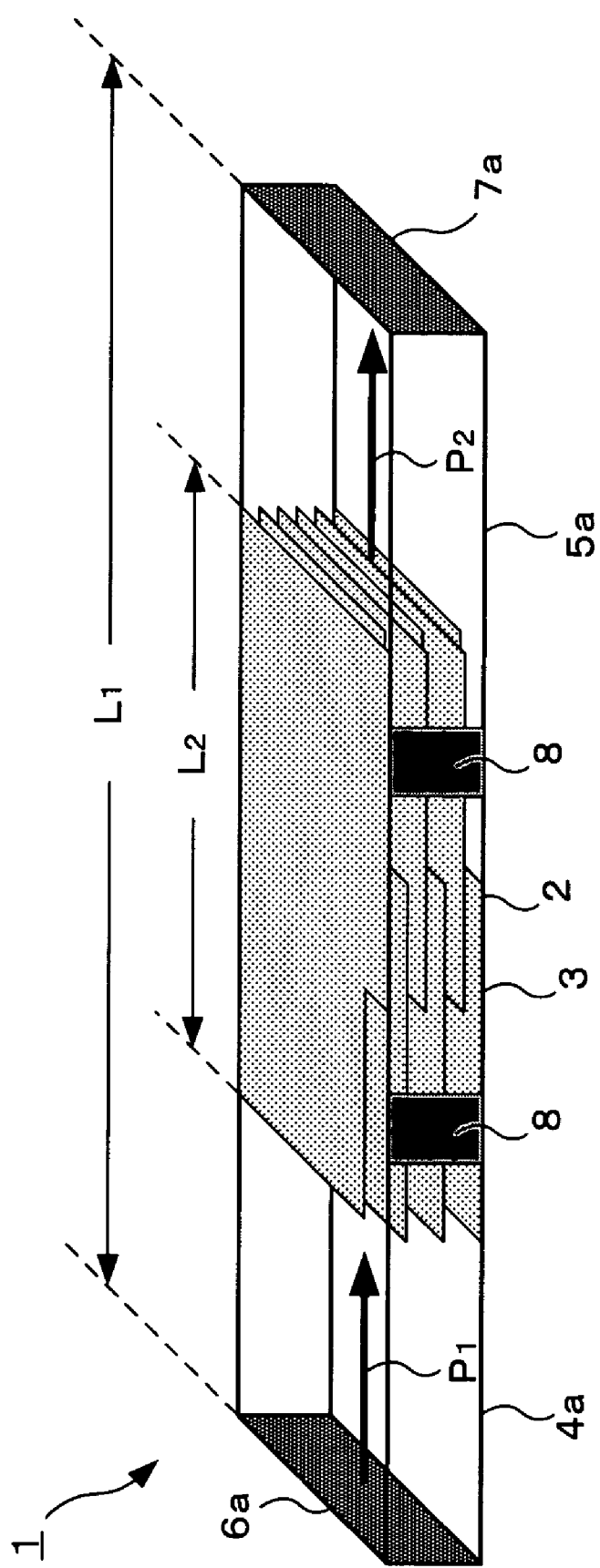
FIG. 1 is a perspective view of a piezoelectric transformer according to a first embodiment of the present invention.

FIG. 1 is a perspective view of a piezoelectric transformer according to a first embodiment of the present invention. In a center drive type piezoelectric transformer 1 shown in FIG. 1, lead titanate zirconate (PZT)-based ceramics are used as a material of the piezoelectric element, and silver (Ag) are used as electrodes. Additionally, the piezoelectric transformer of the present invention is not limited by the material, and other piezoelectric material such as barium titanate (BaTiO3) or the like can also be used as a piezoelectric element, and other conductor such as platinum (Pt), palladium (Pd), gold (Au) nickel (Ni) or copper (Cu) can be also used as electrodes.

In the central part of the piezoelectric transformer 1 shown in FIG. 1, an input part 3 is provided with input electrodes 2 laminated, and piezoelectric element between the input electrodes is polarized in the thickness direction. Along the longitudinal direction of the piezoelectric transformer, output parts 4a and 5a exist on both sides of the input part 3, and the output parts 4a and 5a are polarized along the longitudinal direction in the same direction such as $P_1$ direction and $P_2$ direction, respectively shown in the drawing.

Here, an explanation is given about the direction of polarization by comparing a piezoelectric transformer with output part polarized in the opposite direction with a piezoelectric transformer with output part polarized in the same direction.

On a piezoelectric transformer with output parts polarized along the longitudinal direction in the opposite direction, voltages are generated at two output electrodes with an identical phase and no current flows through a load connected between the output electrodes. Accordingly, even in a configuration for connecting a cold cathode tube between the output electrodes at the both ends of the piezoelectric transformer, the cold cathode tube does not light. The piezoelectric transformer with output parts polarized in the opposite direction is therefore used in such a way that two cold cathode tubes are connected in series between the output electrodes at both ends and GND. When $+V_{out}$ is applied to an output electrode in the case of connecting one cold cathode tube, a voltage of $2 V_{out}$ becomes necessary for two cold cathode tubes. Power loss due to parasitic capacitance with respect to a reflector of a back light of liquid crystal panel or a housing, therefore, becomes four times as large as that in the case with one cold cathode tube.

On the other hand, on a piezoelectric transformer with output parts polarized in the same direction, two cold cathode tubes connected in series between output electrodes at the both ends can be turned on. In this case, when a voltage $+V_{out}$ is applied to an output electrode on one hand, a voltage $-V_{out}$ of a reverse phase is applied to the other output electrode. As a result a voltage $2 V_{out}$ is applied to the two cold cathode tubes. The potential difference from the GND stays at $V_{out}$, then power loss due to parasitic capacitance between either of the electrodes and the reflector of the back light of liquid crystal panel or the housing can be suppressed to two times that in the case with one cold cathode tube provided.

Also when turning on a cold cathode tube with relatively high tube voltage which is used as a back light of a large scale liquid crystal panel, a general Rosen-type piezoelectric transformer has to be applied tube voltage $V_{lamp}$. On the other hand, the piezoelectric transformer with output parts polarized in the same direction may sufficiently be applied electrodes of $+V_{lamp}/2$ and $-V_{lamp}/2$, therefore, it is possible to suppress the loss caused by parasitic capacitance.

Recently, a liquid crystal panel has a trend to be produced large in size, and it is necessary for the cold cathode tube used for a back light to be long in length and high in tube voltage. Since high tube voltage leads to increase in power loss caused by parasitic capacitance, this power loss caused by parasitic capacitance becomes a reason for an increase in power consumption of an inverter.

On the other hand, an output impedance of a piezoelectric transformer with output parts polarized in the same direction is $1/(2\pi f C_2/2)$ where f is frequency and $C_2$ is an electrostatic capacitance of an output on one side. It is four times as large as the output impedance $1/(2\pi f 2C_2)$ of a piezoelectric transformer with output parts polarized in the opposite direction. A piezoelectric transformer with output parts polarized in the same direction is therefore suited better for the case of the large load impedance in the usage of such as two cold cathode tubes connected in series or a cold cathode tube with high tube voltage. It can therefore be said that a piezoelectric transformer with output parts polarized in the opposite direction and a piezoelectric transformer with output parts polarized in the same direction are clearly different in properties from each other.

For the reason described above, the output parts of the piezoelectric transformer according to the first embodiment are polarized in the same direction.

Furthermore, as shown in FIG. 1, in the piezoelectric transformer according to the first embodiment, an output electrode 6a is provided on the entire end face in the longitudinal direction of the output part 4a and an output electrode 7a is provided on the entire end face in the longitudinal direction of the output part 5a. Because the output electrodes are provided in this way at the peak position of vibration in the λ/2 mode, a step-up ratio can be increased. The structure of the output electrode can be simplified, which reduces the residual stress on the periphery of the output electrodes. On the side face of the piezoelectric transformer 1 the external electrodes 8 are provided which connect to the input electrodes 2.

Also, the piezoelectric transformer 1 shown in FIG. 1 is designed to have lengths of the piezoelectric transformer and the electrodes in such a way that $L_2/L_1$ be within a range from 0.1 to 0.5, where $L_1$ is its entire length in the longitudinal direction of the piezoelectric transformer and $L_2$ is a length in the longitudinal direction of the input part.

By such a design, the efficiency of the piezoelectric transformer according to the present invention can be kept at high level from about 94% to 96%. As a result, when the piezoelectric transformer of the present invention is applied to electric equipment, its power consumption can be suppressed in a low level, and when applied to a notebook-sized personal computer, a long life of a battery which is strongly required can be achieved. Furthermore, it is possible to suppress heat generation, to improve reliability on the function of the piezoelectric transformer itself, and to prevent peripheral elements and equipment from being adversely influenced by the heat generation. Especially when two cold cathode tubes are connected which act as back lights of a liquid crystal panel, it can be incorporated as a higher efficient inverter into a circuit of light control drive for suppressing power loss due to parasitic capacitance.

Since high efficiency can be kept stably as long as the quantity is within the range of the above formula, it becomes possible to facilitate mass production of a piezoelectric transformer with functions as designed, and to increase a yield in the manufacturing process. Furthermore, it becomes easy to select the optimum value in consideration of other characteristic items such as a step-up ratio.

A production process of the piezoelectric transformer according to the first embodiment is described below. A green sheet of PZT-based ceramics is produced by an extrusion or a doctor blade method. On the central part of a face of this green sheet, input electrodes are printed by a screen printing method, and also on the central part of a face of another green sheet, input electrodes are printed similarly. These piezoelectric element sheets are laminated one after another, press-bonded, and baked. Then, cutting and polishing are performed, and external electrodes connecting to the input electrodes and output electrodes are provided by silver baking. As shown in FIG. 1, input electrodes on every other layer are connected to the corresponding external electrodes on a side face of the piezoelectric transformer shown in this drawing. Next, polarization processing is carried out in the thickness direction of the input part and in the longitudinal direction of the output part. In this way, the piezoelectric transformer according to the first embodiment is produced.

Figure 2:
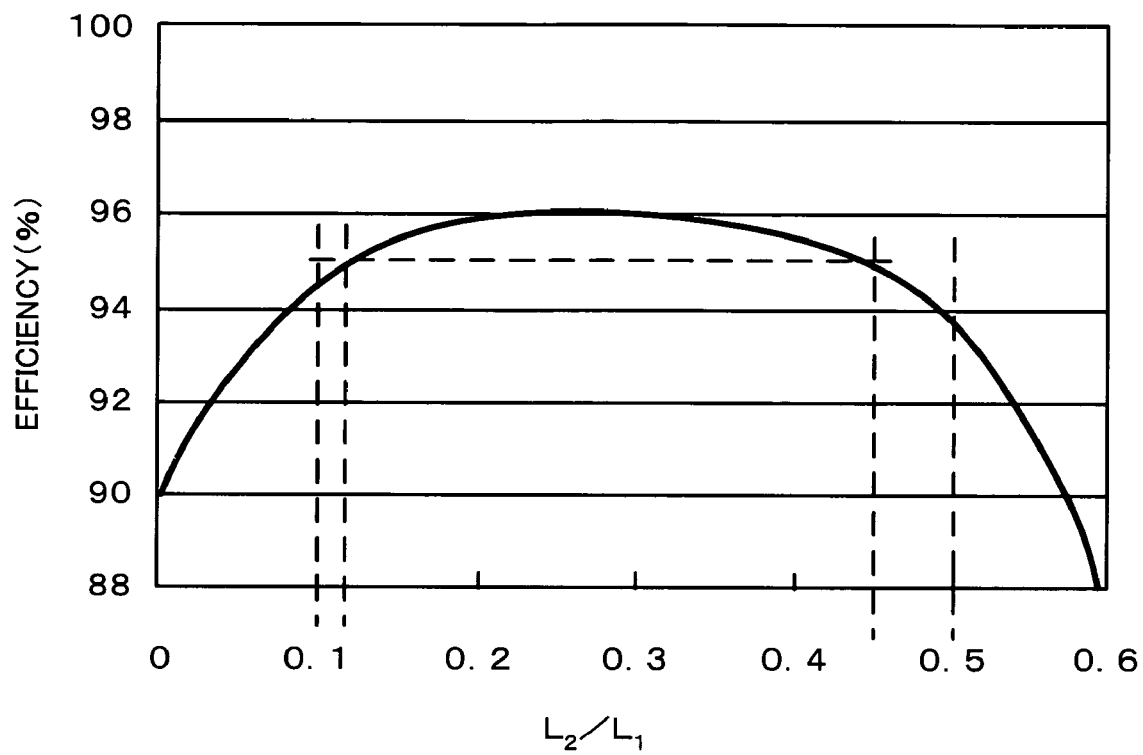
FIG. 2 is a view showing characteristics of the efficiency against ratio $L_2/L_1$ on the piezoelectric transformer with output parts polarized in the same direction.

On the piezoelectric transformer with output parts polarized in the same direction, conversion efficiency was measured by changing a length $L_2$ in the longitudinal direction of the input part relative to the whole length $L_1$ in the longitudinal direction of the piezoelectric transformer. FIG. 2 is a view showing the characteristic of efficiency of the piezoelectric transformer with output parts polarized in the same direction against a ratio $L_2/L_1$. Here, the efficiency on the ordinate indicates the maximum efficiency obtained when frequency is changed for the piezoelectric transformer having respective value of $L_2/L_1$. As shown in FIG. 2, efficiency of the piezoelectric transformer according to the first embodiment became maximum at around $L_2/L_1$ of 0.26. It was confirmed that high efficiency between 94% and 96% was stably obtained for $L_2/L_1$ within a range of 0.1 to 0.5. Especially for a value of $L_2/L_1$ within 0.12 to 0.44, efficiency equal to or higher than 95% was confirmed to be sustained. On the other hand, for $L_2/L_1$ less than 0.1 or higher than 0.5, efficiency decreased markedly as compared with the maximum efficiency, and furthermore change of efficiency to change of $L_2/L_1$ became large, and unstable.

Second Embodiment

Figure 3:
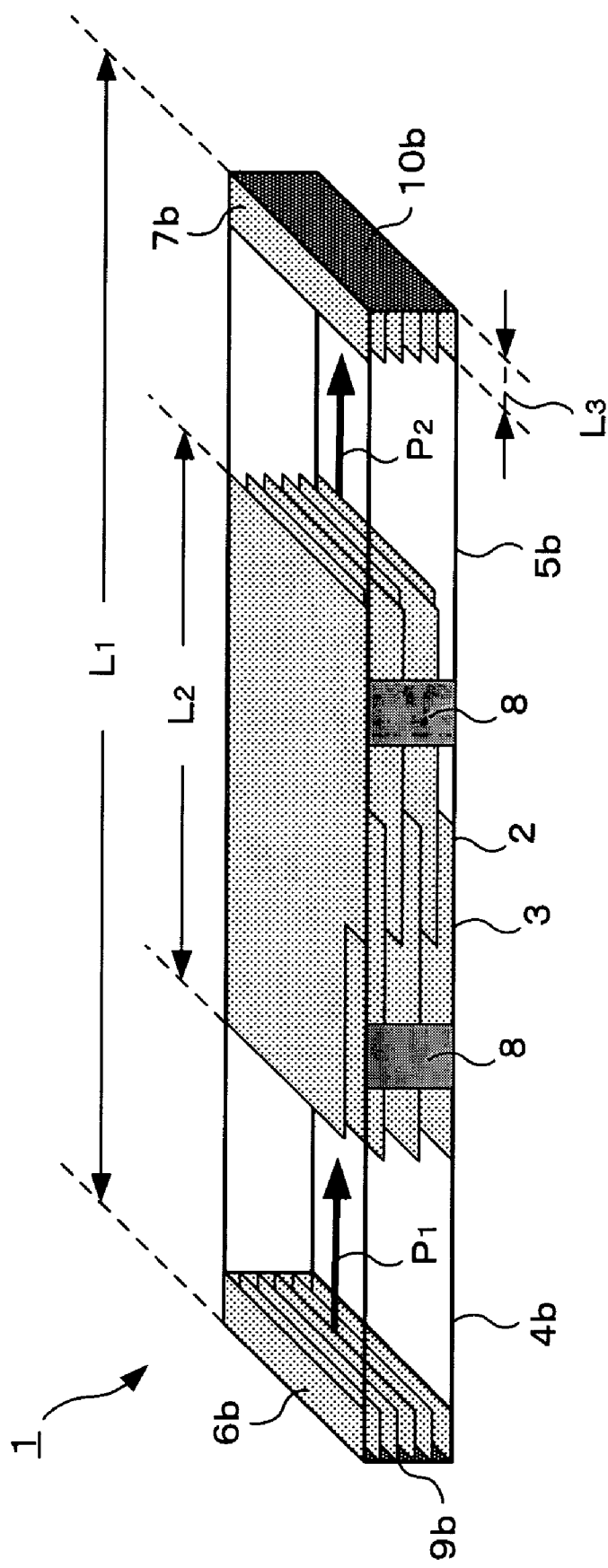
FIG. 3 is a perspective view of a piezoelectric transformer according to a second embodiment of the present invention.

FIG. 3 is a perspective view of a piezoelectric transformer according to a second embodiment of the present invention. In a center drive type piezoelectric transformer 1 shown in FIG. 3, lead titanate zirconate (PZT)-based ceramic is used as a material of a piezoelectric element and silver (Ag) are used as electrodes. Additionally, the piezoelectric transformer of the present invention is not limited by the material, and other piezoelectric material such as barium titanate (BaTiO3) can also be used as a piezoelectric element, and other conductor such as platinum (Pt), palladium (Pd), gold (Au) nickel (Ni), or copper (Cu) can also be used as electrodes.

In the central part of the piezoelectric transformer 1 shown in FIG. 3, an input part 3 is provided where input electrodes 2 are laminated, and piezoelectric element between the input electrodes is polarized in the thickness direction. Along the longitudinal direction of the piezoelectric transformer 1, output parts 4b and 5b exist on both sides of the input part 3, and the output parts 4b and 5b are subjected to polarization processing along the longitudinal direction in the same direction such as $P_1$ direction and $P_2$ direction, respectively shown in this drawing. An output electrode 6b is provided on the end part in the longitudinal direction of the output part 4b and an output electrode 7b is provided on the end part in the longitudinal direction of the output part 5b in such a way that they are laminated in the thickness direction in the inner layer part. The end part is referred to as a part in the vicinity of an end face of the piezoelectric transformer.

Thus, the output electrode of the piezoelectric transformer according to the second embodiment is laminated in the thickness direction of the piezoelectric element in the inner layer part at the end part of each output part. Due to this, efficiency of the piezoelectric transformer becomes higher. Also, this laminated output electrode can be printed simultaneously with the printing of the input electrode on the central part during the manufacturing process of the piezoelectric transformer, and especially it does not require a process of baking of electrodes on both of the end faces of the piezoelectric element. This can improve the process efficiency during manufacturing process. In this case, external electrodes are necessary which connect to the output electrodes, and they can be provided in one process simultaneously with formation of the external electrodes connecting to the input electrodes after the firing of the piezoelectric element.

On a side face of the piezoelectric transformer 1 shown in FIG. 3, external electrodes 8 connecting to the input electrodes 2 are provided, and on the both end faces of the piezoelectric transformer 1 external electrodes 9b and 10b connecting respectively to the output electrodes 6b and 7b are provided.

Further, the piezoelectric transformer 1 shown in FIG. 3 is designed to have lengths of the piezoelectric transformer and the electrodes in such a way that $(4L_2-L_3)/4L_1$ be within a range from 0.1 to 0.5, where $L_1$ is its entire length of the piezoelectric transformer in its longitudinal direction, $L_2$ is a length of the input part in the longitudinal direction, and $L_3$ is a length of either one of the output electrodes in the longitudinal direction.

Due to such a design, the efficiency of the piezoelectric transformer can be kept at high level from about 94% to 96%. As a result, when the piezoelectric transformer of the present invention is applied to electric equipment, its power consumption can be suppressed to a low level. Furthermore, it can suppress heat generation, and improve reliability on the function of the piezoelectric transformer itself and the peripheral equipment.

Since high efficiency can be kept stably as long as the quantity is within the range of the above formula, it becomes possible to facilitate mass production of a piezoelectric transformer with functions as designed, and to increase a yield in the manufacturing process. Furthermore, it becomes easy to select the optimum value in consideration of other characteristic items such as a step-up ratio.

A production process of the piezoelectric transformer according to the second embodiment is described below. A green sheet of PZT-based ceramics is formed by extrusion or doctor blade method. On a face of this green sheet, input electrodes and output electrodes are printed by screen printing method, and also on a face of another green sheet, input electrodes and output electrodes are printed similarly. The output electrodes are printed with a screen designed so that they are positioned at both end parts in the longitudinal direction of the completed form of piezoelectric transformer according to the second embodiment. These piezoelectric element sheets are laminated one after another, press-bonded, and baked. Then, cutting and polishing are performed, and respective external electrodes connecting to the input electrodes and output electrodes are provided by silver baking. During this process, as shown in FIG. 3, input electrodes in every other layer are connected to the corresponding external electrodes on a side face of the piezoelectric transformer shown in this drawing. On the other hand, the external electrodes connecting to the output electrodes are provided on the side or end face as shown in the drawing in such a way that they connect to the output electrodes on every layer. Next, the input part is polarized in the thickness direction and the output part is polarized in the longitudinal direction. In this way, the piezoelectric transformer according to the second embodiment is produced.

Figure 4:
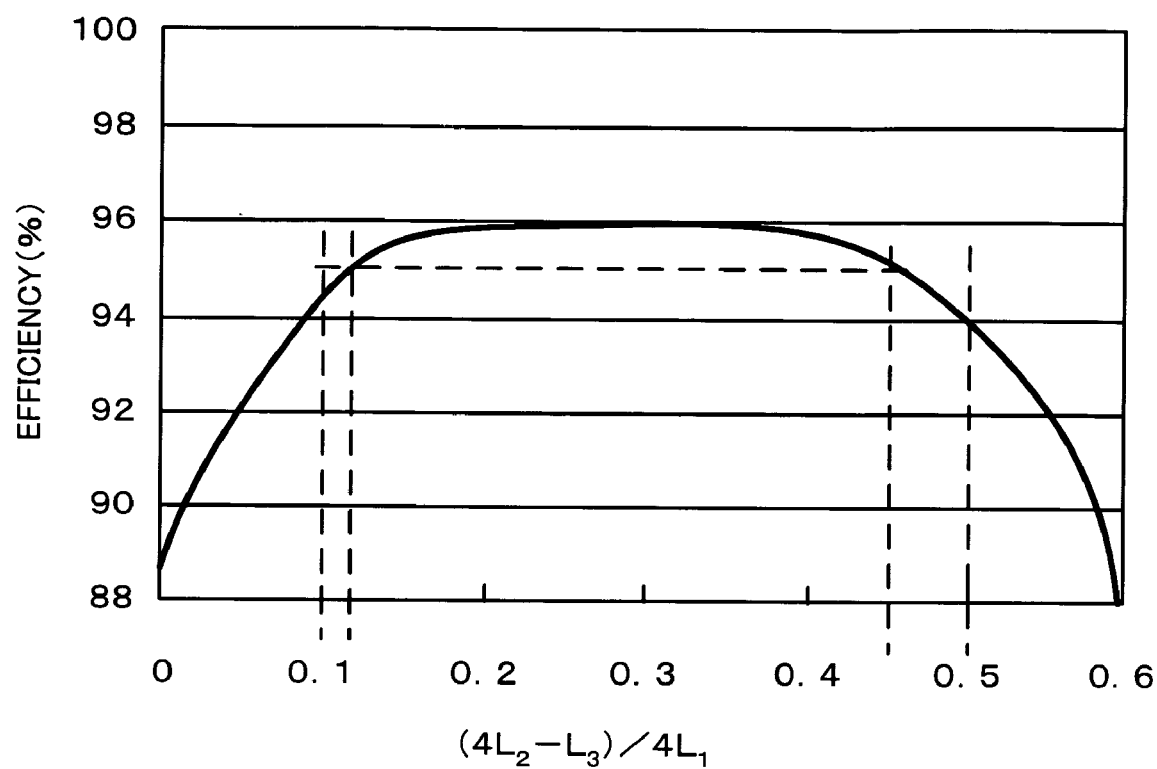
FIG. 4 is a view showing characteristics of the efficiency against ratio $(4L_2-L_3)/4L_1$ on the piezoelectric transformer with output parts polarized in the same direction.

On the piezoelectric transformer with output parts polarized in the same direction, conversion efficiency was measured by changing the whole length $L_1$ of the piezoelectric transformer and a length $L_2$ of the input part against a length $L_3$ in the longitudinal direction of either one of the output electrodes. The length of each of the output electrodes in the longitudinal direction is designed $L_3$ for both output electrodes, and $L_3$ is designed to be constantly proportional to the whole length $L_1$ of the piezoelectric transformer. FIG. 4 shows the characteristics of efficiency of the piezoelectric transformer with output parts polarized in the same direction against a ratio $(4L_2-L_3)/4L_1$. Here, the efficiency on the ordinate, in FIG. 4, indicates the maximum efficiency obtained when frequency is changed for the piezoelectric transformer having respective value of $(4L_2-L_3)/4L_1$. As shown in FIG. 4, efficiency of the piezoelectric transformer became maximum at $(4L_2-L_3)/4L_1$ of about 0.26. It was confirmed that high efficiency between 94% and 96% was stably obtained for $(4L_2-L_3)/4L_1$ within a range of 0.1 to 0.5. Especially for a value of $(4L_2-L_3)/4L_1$ within a range from 0.12 to 0.44, efficiency equal to or higher than 95% was confirmed to be sustained. On the other hand, for $(4L_2-L_3)/4L_1$ less than 0.1 or higher than 0.5, efficiency decreased markedly as compared with the maximum efficiency, and furthermore, the change of efficiency to change of $(4L_2-L_3)/4L_1$ became large, and unstable.

Third Embodiment

Figure 5:
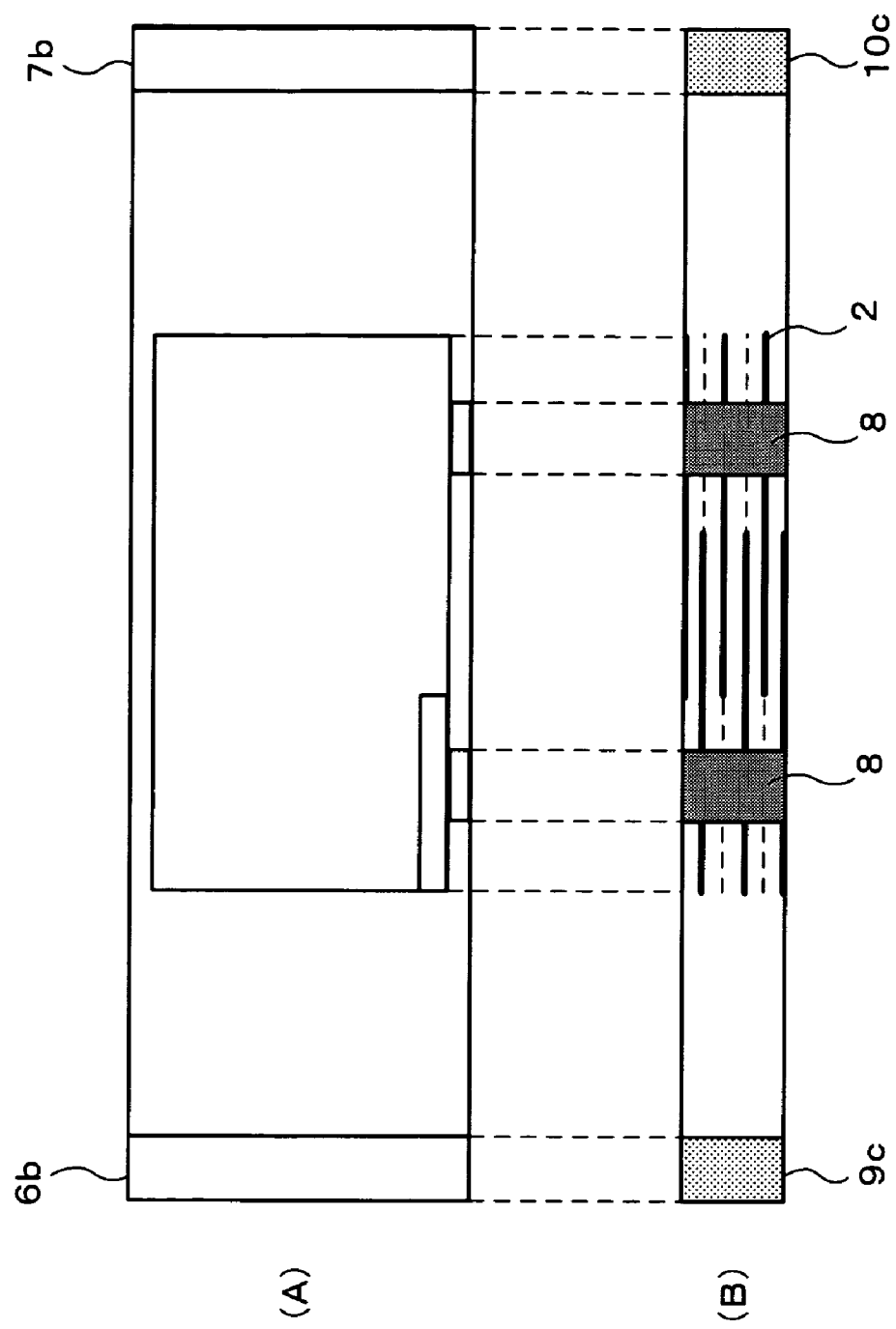
FIG. 5(A) is a top view showing a piezoelectric transformer according to a third embodiment.
FIG. 5(B) is a side view showing the piezoelectric transformer according to the third embodiment.
Figure 6:
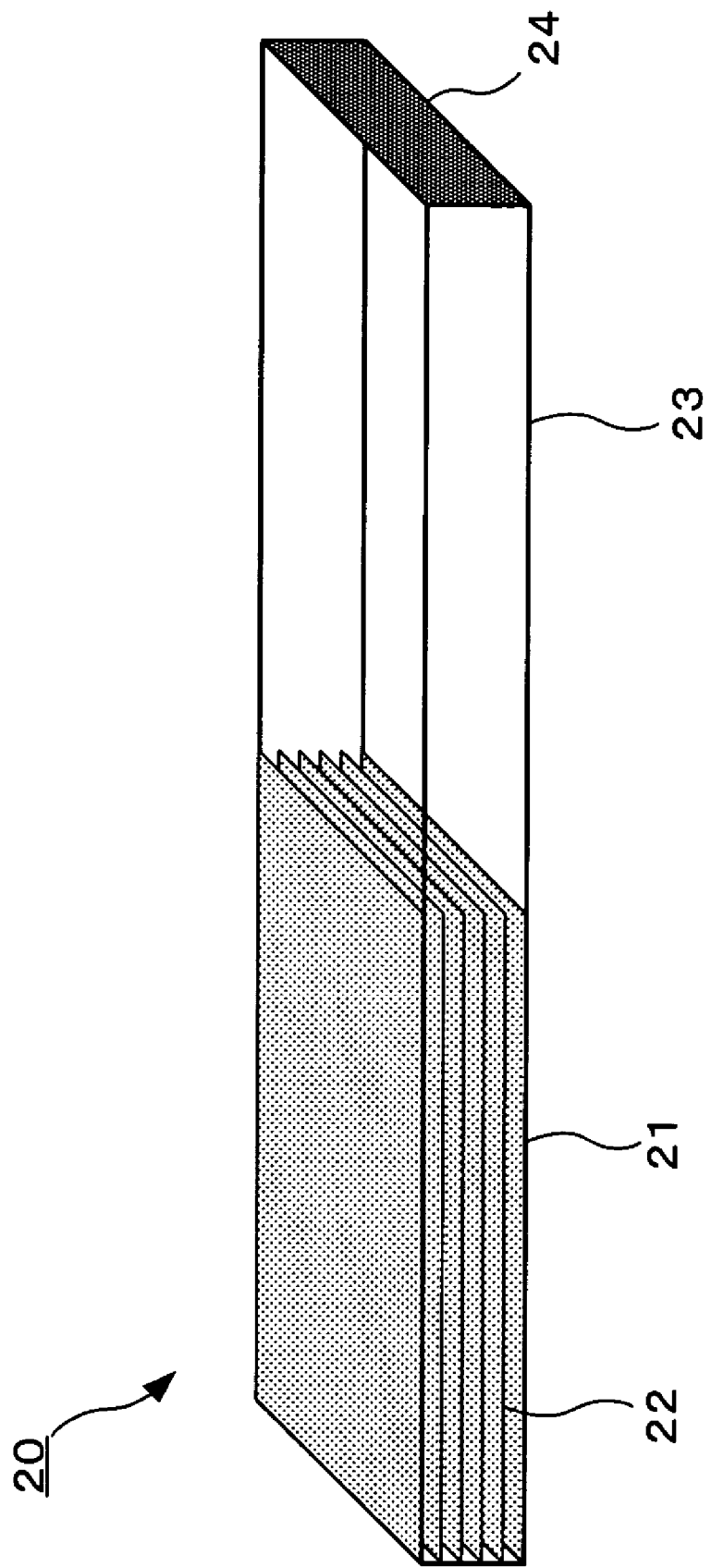
FIG. 6 is a perspective view of a conventional, general Rosen-type piezoelectric transformer.

FIG. 5(A) is a top view of a piezoelectric transformer according to a third embodiment, and FIG. 5(B) is a side view of the piezoelectric transformer according to the third embodiment. As shown in FIGS. 5(A) and 5(B), in the piezoelectric transformer according to the third embodiment, the laminated input electrodes 2 and the output electrodes 6b and 7b laminated in the inner layer part on both ends in the longitudinal direction of the piezoelectric transformer are connected to the external electrode 8, the external electrode 9c and the external electrode 10c, respectively, on a proper side face of the piezoelectric transformer. A production process of the piezoelectric transformer according to the third embodiment is similar to that of the first or second embodiment. Since it is designed to take such a configuration as described above, in the production process of printing the respective external electrodes which are extracting electrodes of the input electrodes and the output electrodes, the printing process of the external electrodes can be finished by printing all together on a specified side face on which the external electrodes are to be provided, thereby leading to simplification and cost reduction of the manufacturing process.

Further, in the piezoelectric transformer according to the third embodiment, all external electrodes were provided on the specific side faces, however, it is also possible to select the face on which the external electrodes are to be disposed depending upon the situation of other process steps. Furthermore, when the piezoelectric transformer of the present invention is incorporated into a circuit, it is possible to select the face on which the external electrodes are to be disposed in consideration of the space and arrangement. As a result, it is possible to improve the efficiency of the manufacturing process and the adaptability in the circuit configuration. Further, the [-shaped structure of electrodes with the output electrode and its external electrode increases the efficiency further more.

Moreover, although the piezoelectric transformer of the present invention operates in the λ/2 mode, a piezoelectric transformer which operates in the 3λ/2 mode has also a range of $(4L_2-L_3)/4L_1$ where high efficiency can be obtained stably.

DESCRIPTION OF THE SYMBOLS

1: Piezoelectric Transformer
2: Input Electrode
3: Input Part
4a: Output Part
4b: Output Part
5a: Output Part
5b: Output Part
6a: Output Electrode
6b: Output Electrode
7a: Output Electrode
7b: Output Electrode
8: External Electrode
9b: External Electrode
9c: External Electrode
10b: External Electrode
10c: External Electrode
L1: Whole Length of a Piezoelectric Transformer in the Longitudinal Direction
L2: Length of an Input Part in the Longitudinal Direction
L3: Length of either one of the Output Electrodes in the Longitudinal Direction
P1: Polarization Direction
P2: Polarization Direction

The invention claimed is:

1. A piezoelectric transformer operating in a half wavelength mode, comprising:
   an input part having input electrodes laminated in a thickness direction on a central part in a longitudinal direction of a piezoelectric element with rectangular shape;
   a pair of output parts provided so as to sandwich said input part along said longitudinal direction; and
   an output electrode provided at an end part of each of said output parts,
   wherein said input part is polarized in the thickness direction between the input electrodes, and said output parts are polarized in the same direction along said longitudinal direction; and
   wherein $L_1$, $L_2$ and $L_3$ satisfy a relation of $0.1 \leq (4L_2-L_3)/4L_1 \leq 0.5$, where $L_1$ is a length of said piezoelectric element in its longitudinal direction, $L_2$ is a length of said input part in said longitudinal direction, and $L_3$ is a length of either one of said output electrodes in said longitudinal direction.

2. The piezoelectric transformer according to claim 1, wherein said output electrodes are formed only at end faces of said respective outputs, and $L_1$ and $L_2$ satisfy the relation of $0.1 \leq L_2/L_1 \leq 0.5$, where $L_1$ is the length in said longitudinal direction of said piezoelectric element and $L_2$ is the length in said longitudinal direction of said input part.

3. The piezoelectric transformer according to claim 1, wherein said output electrode is laminated at an inner layer part of said piezoelectric element in a thickness direction at the end part of said respective output parts.

4. The piezoelectric transformer according to claims 1 to 3, wherein external electrodes connecting to said input electrodes are provided at least on outer face of said input part which is parallel to both said longitudinal direction and thickness direction, and external electrodes connecting to said output electrodes are provided on, at least, both end faces of said respective output parts or on one of outer faces of said output part which are parallel to both said longitudinal direction and thickness direction.

* * * * *